United States Patent
Hillman, Jr. et al.

(10) Patent No.: US 8,255,179 B2
(45) Date of Patent: *Aug. 28, 2012

(54) TIME QUALIFIED FREQUENCY MASK TRIGGER

(75) Inventors: Alfred K. Hillman, Jr., Banks, OR (US); Steven L. Harwood, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 420 days.

This patent is subject to a terminal disclaimer.

(21) Appl. No.: 12/369,673

(22) Filed: Feb. 11, 2009

(65) Prior Publication Data

US 2010/0204939 A1    Aug. 12, 2010

(51) Int. Cl.
*G01R 23/16* (2006.01)
(52) U.S. Cl. .......................... 702/76; 702/124; 702/182
(58) Field of Classification Search .................. 702/76, 702/77, 79, 81, 118, 120–122, 124, 176, 702/183, 193, 182, 66; 324/111, 312; 327/58, 327/307; 340/539.26; 342/70
See application file for complete search history.

(56) References Cited

U.S. PATENT DOCUMENTS

| | | | |
|---|---|---|---|
| 4,870,348 A | 9/1989 | Smith et al. | |
| 5,103,402 A | 4/1992 | Morton et al. | |
| 5,381,150 A | 1/1995 | Hawkins et al. | |
| 7,251,577 B2 * | 7/2007 | Bernard et al. | 702/124 |
| 2006/0015277 A1 | 1/2006 | Bernard et al. | |
| 2006/0025947 A1 | 2/2006 | Earls | |
| 2007/0174021 A1 * | 7/2007 | Bernard et al. | 702/182 |
| 2007/0282542 A1 | 12/2007 | Duff et al. | |
| 2010/0204937 A1 * | 8/2010 | Harwood | 702/66 |

OTHER PUBLICATIONS

U.S. Appl. No. 12/369,660, filed Feb. 11, 2009, "Amplitude Discrimination Using the Frequency Mask Trigger", Inventors: Alfred K. Hillman, Jr., et al., Assignee: Tektronix, Inc.
U.S. Appl. No. 12/369,669, filed Feb. 11, 2009, "Power Trigger With Time Qualified and Sequential Event Capability", Inventor: Steven L. Harwood, Assignee: Tektronix, Inc.
Non-Final Rejection in U.S. Appl. No. 12/369,660 dated Jun. 22, 2011.
Non-Final Rejection in U.S. Appl. No. 12/369,669 dated Jun. 28, 2011.
Anonymous: "Fundamentals of Real-Time Spectrum Analysis", 2008, pp. 1-52, XP002668787, Retrieved from the Internet: URL: http://www.tektronix-resources.com/0803pulsedrf/fundamentals spectrumanalysis.pdf—[retrieved on Feb. 1, 2012].
Notice of Allowance in U.S. Appl. No. 12/369,660, dated Feb. 15, 2012.

* cited by examiner

*Primary Examiner* — John H Le
(74) *Attorney, Agent, or Firm* — Michael A. Nelson

(57) ABSTRACT

A time qualified frequency mask trigger triggers on signals that violate a frequency mask for at least a specified time duration. A frame of digital data representing an input signal is transformed into a frequency spectrum having at least one frequency bin, with each frequency bin having a power amplitude value. A trigger signal is generated when any of the power amplitude values violates an associated reference power level for at least a specified time duration.

20 Claims, 1 Drawing Sheet

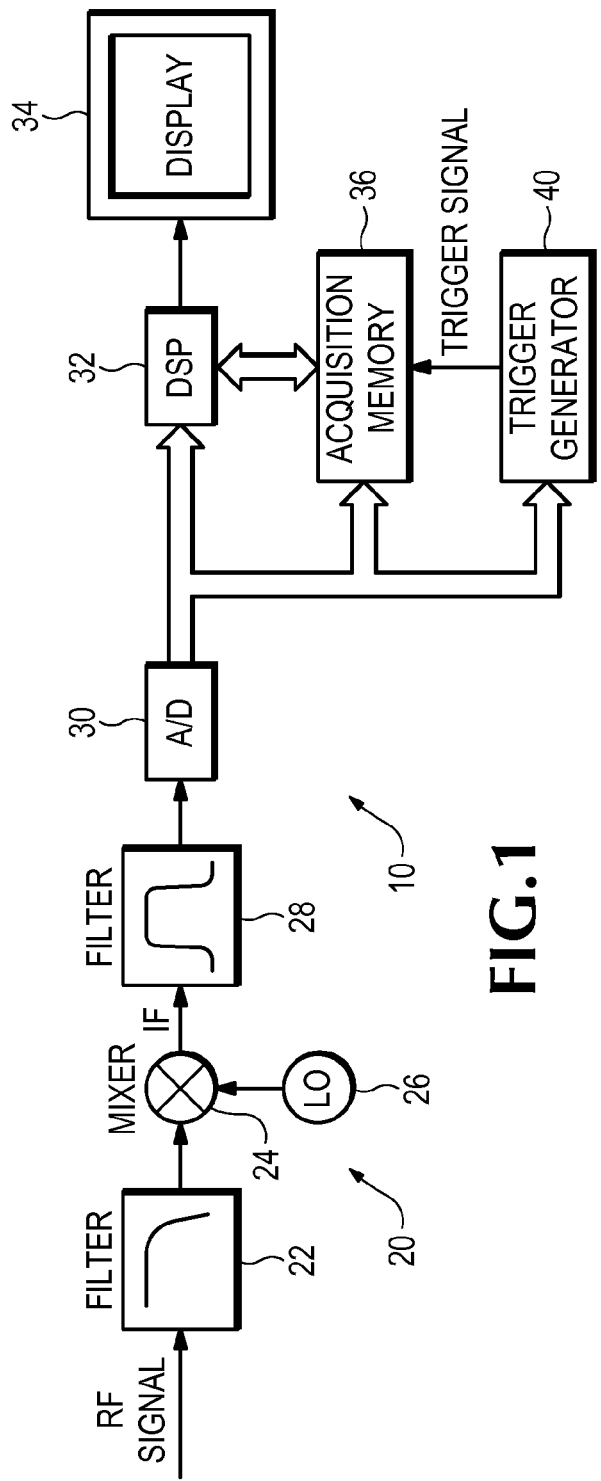
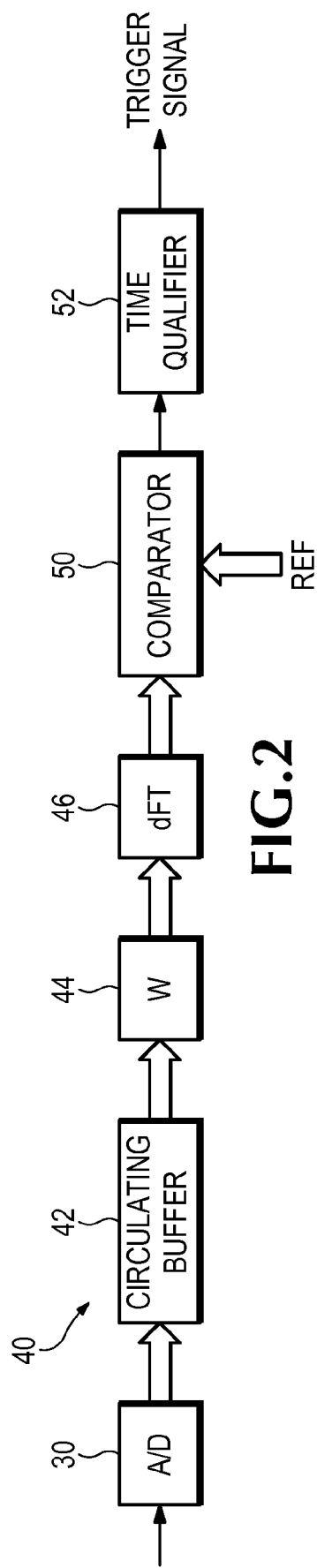
FIG.1
FIG.2

TIME QUALIFIED FREQUENCY MASK TRIGGER

FIELD OF THE INVENTION

The present invention relates to test and measurement instruments, and more particularly to triggers for use in the frequency domain.

BACKGROUND OF THE INVENTION

Real-time spectrum analyzers such as the RSA6100 and RSA3400 families available from Tektronix, Inc. of Beaverton, Oreg. trigger on, capture, and analyze RF signals in real-time. These instruments capture seamless blocks of data so that, unlike conventional frequency swept spectrum analyzers, no data is missed or lost.

These instruments have the capability to trigger on events which occur in the frequency domain. This capability, known as a "frequency mask trigger," is described in U.S. Pat. No. 5,103,402. The frequency mask trigger calculates the frequency spectrum of real-time data provided by the instrument's receiver system and then compares the frequency spectrum to a user-defined frequency mask. When the frequency spectrum violates the frequency mask, a trigger signal is generated which causes a seamless block of data representing the received RF signal to be stored containing the triggering event as well as what happened immediately before and immediately after the triggering event. In this manner the frequency mask trigger waits for a single specific spectral event to occur.

SUMMARY OF THE INVENTION

In some instances, a user may want to trigger on a pulsed or bursted RF signal in the presence of other, often much larger transitory signals. For example, a user may want to trigger on a digital RF signal in the presence of interference. The conventional frequency mask trigger cannot reliably trigger on the digital RF signal, but rather, may erroneously trigger on the interference, because it cannot distinguish between the digital RF signal and the interference because both signals violate the frequency mask.

What is desired is a frequency mask trigger capable of triggering on a pulsed or bursted RF signal in the presence of other transitory signals.

Accordingly, embodiments of the present invention provide a time qualified frequency mask trigger that triggers on signals that violate a frequency mask for at least a specified time duration. A frame of digital data representing an input signal is transformed into a frequency spectrum having at least one frequency bin, with each frequency bin having a power amplitude value. A trigger signal is generated when any of the power amplitude values violates an associated reference power level for at least a specified time duration.

The objects, advantages and other novel features of the present invention are apparent from the following detailed description when read in conjunction with the appended claims and attached drawings.

BRIEF DESCRIPTION OF THE DRAWINGS

FIG. 1 illustrates a simplified, high-level block diagram of a real-time spectrum analyzer.

FIG. 2 illustrates a simplified, high-level block diagram of a trigger generator according to an embodiment of the present invention.

DETAILED DESCRIPTION OF THE INVENTION

Referring now to FIG. 1, a real-time spectrum analyzer 10 is shown having an input processor 20 for receiving a radio frequency (RF) input signal. The input processor 20 includes an optional image reject filter 22 followed by a mixer 24 that converts the filtered input signal to an intermediate frequency (IF) signal using a local oscillator (LO) 26. The image reject filter 22 may be implemented using a lowpass filter, a bandpass filter, or a highpass filter. The IF signal is passed through a bandpass filter 28 and then input to an analog-to-digital (A/D) converter 30 to provide a digital signal for further processing. The digital signal is input to a digital signal processor (DSP) 32 for real-time processing for display on a monitor 34, such as in the form of a spectrogram as described in U.S. Pat. No. 4,870,348. The digital signal also is input to an acquisition memory 36 and to a trigger generator 40. In some embodiments, the acquisition memory 36 may be implemented using a circular memory. When the trigger generator 40 detects a time qualified trigger event, a trigger signal is generated that causes the acquisition memory 36 to store a seamless block of digital data from the digital signal for subsequent processing by the DSP 32 or for offloading to another processor (not shown) for non-real-time post-processing.

Referring now to FIG. 2, a trigger generator 40 according to an embodiment of the present invention is shown having a circulating buffer 42 for storing digital data representing the digital signal. In one embodiment, circulating buffer 42 may be implemented as a part of acquisition memory 36. In another embodiment, circulating buffer 42 may be implemented as a separate memory. A frame of digital data is read from circulating buffer 42 and windowed by a windowing function 44 such as a Blackman-Harris window. The windowed frame is converted to the frequency domain using a discrete Fourier transform (dFT) 46 to produce a frequency spectrum having at least one frequency bin, with each frequency bin having a power amplitude value. Each power amplitude value is input to a comparator 50 for comparison with a reference power level associated with each frequency bin. When any power amplitude value violates the associated reference power level, comparator 50 generates an output signal indicating the occurrence of a "trigger event." "Violate" means that the power signal is either greater than or less than the trigger level depending on whether the user defines a trigger slope as "positive" or "negative." The reference power levels specified for each frequency bin within the signal spectrum define a frequency mask trigger. When the output signal of comparator 50 is present for, depending on a specified timer mode, either at least a specified time duration or less than the specified time duration, time qualifier 52 generates the trigger signal indicating the occurrence of a "time qualified trigger event." The minimum time resolution of the specified time duration is equal to the time duration of one frame because the frequency mask trigger operates on frames of data.

In one embodiment of the present invention, time qualifier 52 operates according to the following logic:

If the user specifies that the trigger signal is to be generated when the trigger event is present for at least the specified time duration, then for each frame of digital data:

a) If the output of the comparator is TRUE, then a counter is incremented.

b) If the output of the comparator is FALSE, then the counter is reset to zero.

c) If the counter value exceeds the specified number of frames, then the trigger signal is generated.

If the user specifies that the trigger signal is to be generated when the trigger event is present for less than the specified time duration, then for each frame of digital data:
  a) If the output of the comparator is TRUE, then the counter is incremented.
  b) If the output of the comparator is FALSE and the counter value is greater than zero but less than the specified number of frames, then the trigger signal is generated and the counter is reset to zero.

The embodiments of the present invention described above do not require that the same frequency bin be violated with each frame of digital data in order to generate the trigger signal, they merely require that some frequency bin be violated. For example, frequency bin 1 may be violated in the first frame, frequency bin 2 may be violated in the second frame, and so on. However, in alternative embodiments of the present invention, the trigger signal is only generated when a specified frequency bin or collection of bins is violated with each frame.

In another alternative embodiment of the present invention, time qualifier 52 generates the trigger signal on the occurrence of a sequence of time qualified trigger events, with each time qualified trigger event having an associated time duration. For example, the trigger signal may be generated on the occurrence of a first trigger event which is present for at least a specified time duration, followed by a second trigger event which is present for less than a second specified time duration. The sequence of time durations and timer modes may be stored in the time qualifier 52 or in a memory (not shown).

In another alternative embodiment of the present invention, time qualifier 52 generates the trigger signal after a time qualified trigger event or a sequence of time qualified trigger events have occurred a specified number of times.

In various embodiments, the trigger slope, reference power levels, time duration, and timer mode may be specified by the user or by a standard.

In order to provide real-time triggering, the trigger generation processing must be fast enough to keep up with the digital signal stream.

The embodiment described above uses a discrete Fourier transform to convert a time domain signal into a frequency spectrum. Alternatively, other transforms may be used such as a Hartley transform or a chirp-Z transform. Additionally, non-transform-based techniques may be used such as a bank of parallel filters, including finite impulse response filters and continuous-time analog filters.

Although embodiments of the present invention have application to spectrum analyzers in particular, any test and measurement instrument which acquires data in response to a trigger signal may use the time qualified frequency mask trigger.

It will be appreciated from the foregoing that the present invention represents a significant advance in the field of frequency domain triggering. A time qualified frequency mask trigger may detect many useful trigger conditions. Although a specific embodiment of the invention has been illustrated and described for purposes of illustration, it will be understood that various modifications may be made without departing from the spirit and scope of the invention. Accordingly, the invention should not be limited except as by the appended claims.

What is claimed is:

1. An instrument comprising:
    an input processor for receiving an input signal and producing a digital signal;
    a trigger signal generator for generating a trigger signal; and
    an acquisition memory for storing a seamless block of digital data from the digital signal in response to the trigger signal;
    the trigger signal generator comprising:
    a time-to-frequency converter for converting a frame of digital data from the digital signal into a frequency spectrum having at least one frequency bin, with each frequency bin having a power amplitude value;
    a comparator for detecting a trigger event, a trigger event being the condition in which at least one of the power amplitude values violates an associated reference power level; and
    a time qualifier for measuring the duration of the trigger event with a timer and generating the trigger signal on the occurrence of a time qualified trigger event.

2. The instrument as recited in claim 1 wherein the time qualified trigger event comprises a trigger event which is present for at least a specified time duration.

3. The instrument as recited in claim 1 wherein the time qualified trigger event comprises a trigger event which is present for less than a specified time duration.

4. The instrument as recited in claim 2 or 3 wherein the time qualifier generates the trigger signal on the occurrence of a sequence of time qualified trigger events, with each trigger event having an associated specified time duration.

5. The instrument as recited in claim 4 wherein the time qualifier generates the trigger signal after a time qualified trigger event or a sequence of time qualified trigger events has occurred a specified number of times.

6. The instrument as recited in claim 1 wherein the input processor comprises:
    a mixer for mixing the input signal with a local oscillator signal to produce an intermediate frequency signal;
    a bandpass filter for filtering the intermediate frequency signal to produce a filtered intermediate frequency signal; and
    an analog-to-digital converter for digitizing the filtered intermediate frequency signal to produce the digital signal.

7. The instrument as recited in claim 6 wherein the input processor further comprises an image reject filter for filtering the input signal.

8. The instrument as recited in claim 1 wherein the trigger signal generator further comprises a windowing function for windowing the frame of digital data.

9. The instrument as recited in claim 1 wherein the time-to-frequency converter comprises a time-to-frequency transform selected from the group consisting of a discrete Fourier transform, a discrete Hartley transform, and a chirp-Z transform.

10. The instrument as recited in claim 1 wherein the time-to-frequency converter comprises a bank of parallel filters selected from the group consisting of finite impulse response filters and continuous time analog filters.

11. A method of acquiring data within a test and measurement instrument comprising the steps of:
    receiving an input signal and producing a digital signal;
    generating a trigger signal; and
    storing a seamless block of digital data from the digital signal in response to the trigger signal;
    the generating step comprising the steps of:
    converting a frame of digital data from the digital signal into a frequency spectrum having at least one frequency bin, each frequency bin having a power amplitude value;
    detecting a trigger event, a trigger event being the condition in which at least one of the power amplitude values violates an associated reference power level;

measuring the duration of the trigger event with a timer; and producing the trigger signal on the occurrence of a time qualified trigger event.

12. The method as recited in claim 11 wherein the time qualified trigger event comprises a trigger event which is present for at least a specified time duration.

13. The method as recited in claim 11 wherein the time qualified trigger event comprises a trigger event which is present for less than a specified time duration.

14. The method as recited in claim 12 or 13 wherein the producing step generates the trigger signal on the occurrence of a sequence of time qualified trigger events, with each trigger event having an associated specified time duration.

15. The method as recited in claim 14 wherein the producing step generates the trigger signal after a time qualified trigger event or a sequence of time qualified trigger events has occurred a specified number of times.

16. The method as recited in claim 11 wherein the receiving step comprises:

mixing the input signal with a local oscillator signal to produce an intermediate frequency signal;

bandpass filtering the intermediate frequency signal to produce a filtered intermediate frequency signal; and digitizing the filtered intermediate frequency signal to produce the digital signal.

17. The method as recited in claim 16 wherein the receiving step further comprises the step of filtering the input signal with an image reject filter.

18. The method as recited in claim 11 wherein the generating step further comprises the step of windowing the frame of digital data with a windowing function.

19. The method as recited in claim 11 wherein the converting step uses a time-to-frequency transform selected from the group consisting of a discrete Fourier transform, a discrete Hartley transform, and a chirp-Z transform.

20. The method as recited in claim 11 wherein the converting step uses a bank of parallel filters selected from the group consisting of finite impulse response filters and continuous time analog filters.

* * * * *